United States Patent
Kim et al.

(10) Patent No.: US 9,607,679 B1
(45) Date of Patent: Mar. 28, 2017

(54) REFRESH CONTROL DEVICE

(71) Applicant: SK hynix Inc., Icheon-si, Gyeonggi-do (KR)

(72) Inventors: Youk Hee Kim, Suwon-si (KR); Jun Gi Choi, Bucheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/169,216

(22) Filed: May 31, 2016

(30) Foreign Application Priority Data

Mar. 2, 2016 (KR) .......................... 10-2016-0025183

(51) Int. Cl.
  *G11C 7/00* (2006.01)
  *G11C 11/406* (2006.01)
  *G11C 11/409* (2006.01)

(52) U.S. Cl.
  CPC ...... *G11C 11/40615* (2013.01); *G11C 11/409* (2013.01)

(58) Field of Classification Search
  CPC ............ G11C 11/406; G11C 11/40615; G11C 2211/406; G05B 2219/34193

USPC ......................................................... 365/222
See application file for complete search history.

(56) References Cited

U.S. PATENT DOCUMENTS

| 9,025,405 B2 | 5/2015 | Jeong |
| 9,153,294 B2 | 10/2015 | Kang |
| 2016/0012880 A1* | 1/2016 | Kim .................. G11C 11/40622 365/189.07 |

* cited by examiner

*Primary Examiner* — Huan Hoang
(74) *Attorney, Agent, or Firm* — William Park & Associates Ltd.

(57) ABSTRACT

A refresh control device is disclosed, which relates to a technology for efficiently storing weak cell refresh addresses. The refresh control device includes a weak cell address storage circuit to store a weak address, a weak cell address control circuit, and a row address control circuit. The weak cell address control circuit outputs a weak enable signal and a row address by comparing a refresh address with the weak address, and only activates the refresh address according to the comparison result or activates both the refresh address and the row address. The row address control circuit controls a refresh operation by selectively activating a word line of a bank in response to the refresh address, the weak enable signal, and the row address.

19 Claims, 7 Drawing Sheets

REFRESH CONTROL DEVICE

CROSS-REFERENCE TO RELATED APPLICATION

This application claims priority under 35 U.S.C. §119(a) to Korean patent application No. 10-2016-0025183, filed on Mar. 2, 2016, the disclosure of which is hereby incorporated in its entirety by reference herein.

BACKGROUND OF THE INVENTION

1. Technical Field

Embodiments of the present disclosure relate to a refresh control device, and more particularly to a technology for efficiently storing weak cell refresh addresses.

2. Related Art

In recent times, consumer demand for high-capacity dynamic random access memories (DRAMs) for use in mobile electronic appliances including smartphones, or the like, is rapidly increasing. Generally, data stored in memory cells of a semiconductor memory device such as DRAM may be changed by a leakage current. Therefore, a refresh operation is needed for periodically recharging data stored in the memory cells.

A memory cell of a dynamic semiconductor memory, such as DRAM, stores data in a capacitive element. Due to leakage of charges from the capacitive element, the memory cell must be periodically refreshed. The refresh process performs a read operation for restoring a level of charges stored in the memory cell to an original state.

Specifically, a semiconductor memory device such as a Double Data Rate Synchronous DRAM (DDR SDRAM) includes a plurality of memory banks storing data therein, and each memory bank includes tens of millions of memory cells therein. Each memory cell includes a cell capacitor and a cell transistor. The semiconductor memory device may charge or discharge the cell capacitor to store data therein.

The charge stored in the cell capacitor must be ideally constant if an additional control signal is not used. However, the charge stored in the cell capacitor may be unavoidably changed due to a difference in voltage between the cell capacitor and the peripheral circuit.

In other words, charges may leak outside the cell capacitor if the cell capacitor is charged with electricity, or charges may be received when the cell capacitor is discharged. Changing the amount of charge stored in the cell capacitor may indicate that data stored in the cell capacitor has changed, resulting in loss of the stored data. The semiconductor memory device may perform a refresh operation to prevent the stored data from being lost.

Different types of refresh methods have been developed over time. Generally, the auto refresh method uses a refresh timer located outside of a memory chip, such that the memory chip can perform the refresh operation in response to a periodic refresh command from a controller.

The self refresh method is configured to use a refresh timer located inside the memory chip, such that all the memory chips are configured to request a refresh start command from the controller.

BRIEF SUMMARY OF THE INVENTION

Various embodiments of the present disclosure are directed to providing a refresh control device that substantially obviates one or more problems due to limitations and disadvantages of the related art.

The embodiment of the present disclosure relates to a refresh control device for storing a weak cell address #1 in a non-volatile address storage circuit irrespective of the number of refresh times for the same weak cell, such that the address storage circuit is reduced in size.

In accordance with an embodiment of the present disclosure, a refresh control device includes: a weak cell address storage circuit configured to sequentially store a weak address corresponding to a weak cell; a weak cell address control circuit configured to output a weak enable signal and a row address corresponding to the weak address by comparing a refresh address with the weak address, activate only the refresh address according to the result of the comparison, or activate both the refresh address and the row address; and a row address control circuit configured to control a refresh operation by selectively activating a word line of a bank in response to the refresh address, the weak enable signal, and the row address.

In accordance with another embodiment of the present disclosure, a refresh control device includes: a refresh counter configured to generate a refresh address by counting a refresh signal; a weak cell address storage circuit configured to sequentially store a weak address corresponding to a weak cell; a weak cell address control circuit configured to output a weak enable signal and a row address corresponding to the weak address by comparing the refresh address with the weak address, activate only the refresh address according to the result of the comparison, or activate both the refresh address and the row address; a row address control circuit configured to selectively activate a word line in response to the refresh address, the weak enable signal, and the row address; and a bank in which the word line is selectively activated according to a control signal of the row address control circuit such that a refresh operation is carried out.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to the embodiments of the present disclosure, examples of which are illustrated in the accompanying drawings. Wherever possible, the same reference numbers will be used throughout the drawings to refer to the same or like parts.

Figure 1:
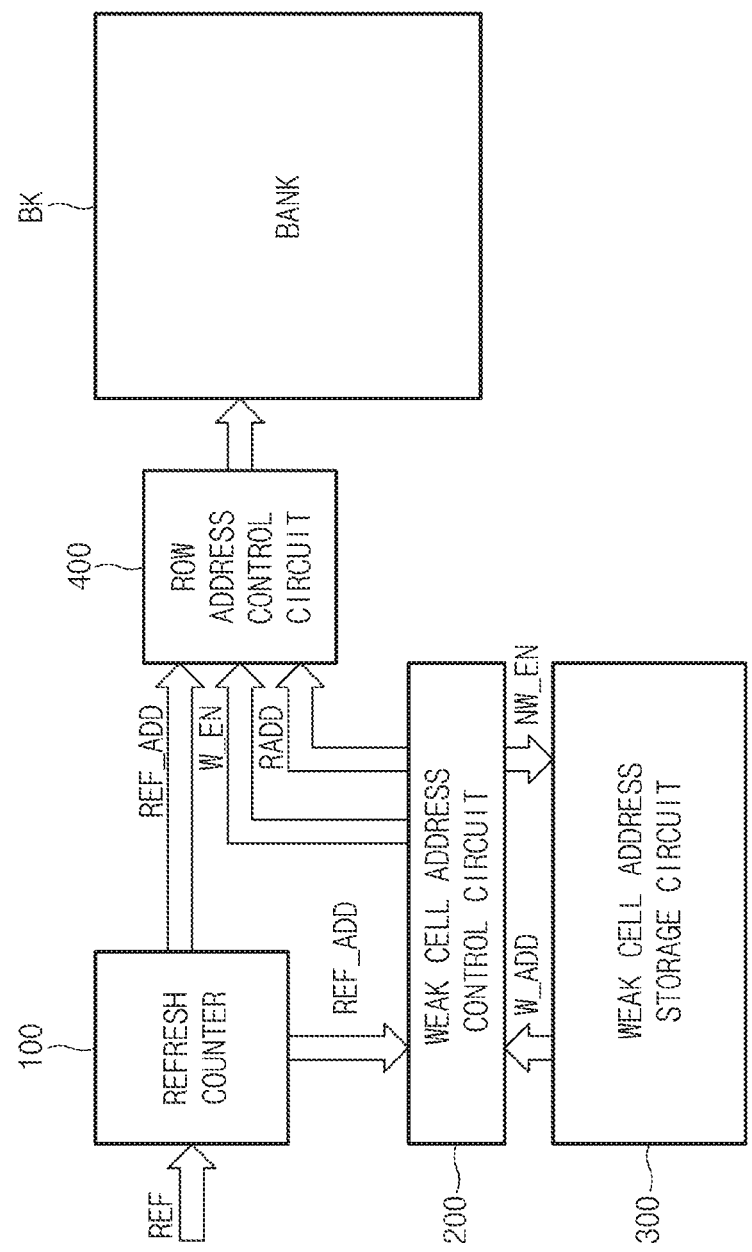
FIG. 1 is a block diagram illustrating a representation of an example of a refresh control device according to an embodiment of the present disclosure.

FIG. 1 is a block diagram illustrating a representation of an example refresh control device according to an embodiment of the present disclosure.

Referring to FIG. 1, the refresh control device may include a refresh counter 100, a weak cell address control circuit 200, a weak cell address storage circuit 300, a row address control circuit 400, and a bank (BK).

The refresh counter 100 may output a refresh address (REF_ADD) to the weak cell address control circuit 200 and the row address control circuit 400 in response to a refresh signal (REF). Whenever the refresh signal (REF) is received by the refresh counter 100, the refresh counter 100 may sequentially count the received refresh signal (REF) and generate the refresh address (REF_ADD), where the refresh address (REF_ADD) may be configured to access a memory cell in which a refresh operation is carried out. Therefore, a refresh operation of a memory cell accessed by the refresh address (REF_ADD) may be carried out sequentially.

The weak cell address control circuit 200 may compare the refresh address (REF_ADD) with a weak address (W_ADD), and output a weak enable signal (W_EN) and a row address (RADD) to the row address control circuit 400. The weak cell address control circuit 200 may output a subsequent weak enable signal (NW_EN) to the weak cell storage circuit 300.

In addition, the weak cell address storage circuit 300 may sequentially store the weak address (W_ADD) corresponding to a weak cell. Upon receiving a subsequent weak enable signal (NW_EN) from the weak cell address control circuit 200, the weak cell address storage circuit 300 may sequentially output the stored weak address (W_ADD) to the weak cell address control circuit 200. The weak cell address storage circuit 300 may acquire information regarding the cell having weak characteristics through wafer testing, and may store the weak address (W_ADD) corresponding to the weak cell.

The row address control circuit 400 may control a refresh operation by selectively activating a word line of the bank (BK) in response to receiving the refresh address (REF_ADD), the weak enable signal (W_EN), and the row address (RADD). The bank (BK) may include a plurality of memory cells associated with word lines, and may perform a refresh operation of a memory cell upon receiving a control signal from the row address control circuit 400. In other words, the bank (BK) in which a word line is selectively activated according to the control signal of the row address control circuit 400 may lead to a refresh operation being carried out.

Cells of the semiconductor device may retain cell data through a periodic refresh operation. The size of the semiconductor device may shrink as technology develops, storage capacitance of the cell may be reduced and it may thus become difficult to guarantee self refresh characteristics of a cell. Accordingly, the refresh period of a cell having weak characteristics is shortened. Thus, refreshing of the cell may be frequently carried out so that memory characteristics can be guaranteed.

As a result, the refresh control device according to embodiments stores information regarding a weak cell having a retention time shorter than a refresh time of the memory cell in the weak cell address storage circuit 300 acting as a non-volatile storage device, and the refresh control device performs a refresh operation before data of the weak cell is lost.

Figure 2:
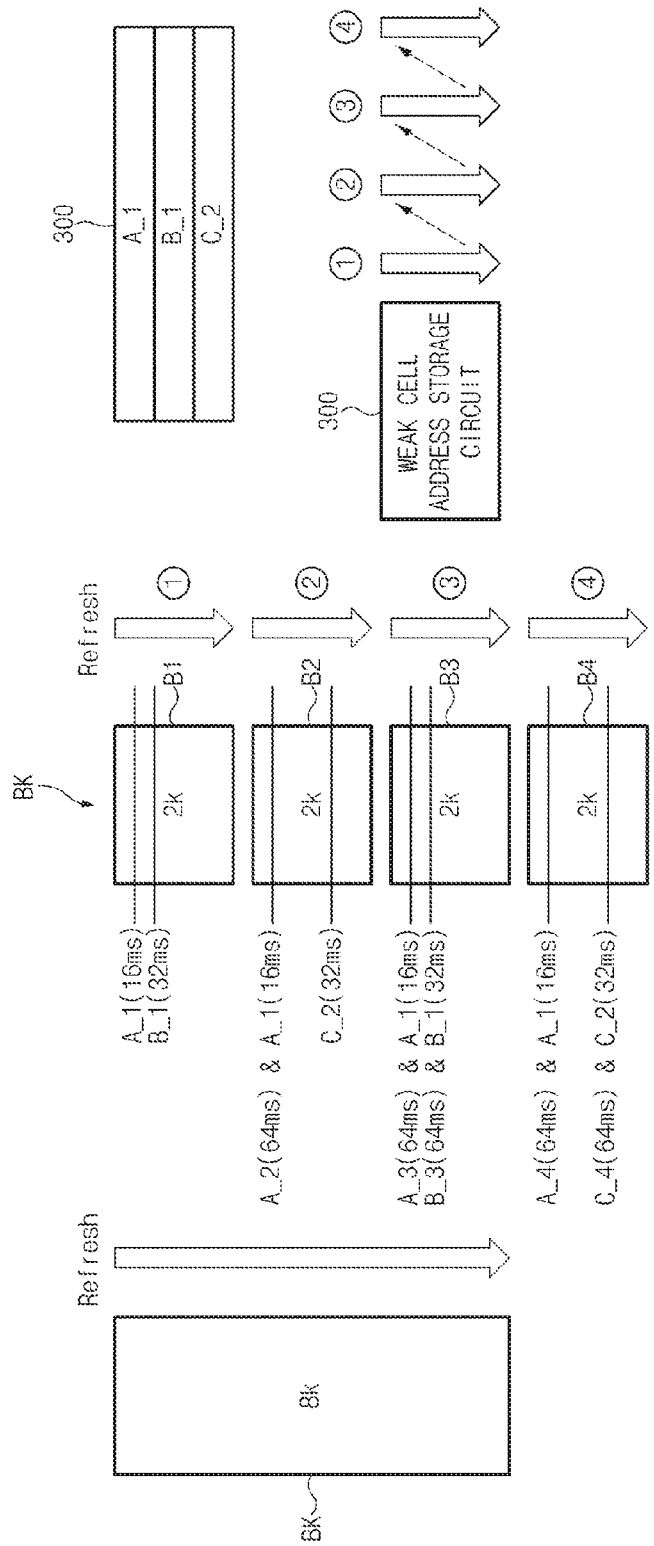
FIG. 2 is a block diagram illustrating a representation of an example of an address comparison operation of a weak cell address control circuit shown in FIG. 1.

FIG. 2 is a block diagram illustrating a representation of an example of an address comparison operation of the weak cell address control circuit 200 shown in FIG. 1.

Information stored in each cell (i.e., a unit for storing input information) of DRAMs from among semiconductor memories may disappear according to a time lapse, different from Static Random Access Memories (SRAMs), or flash memories. In order to prevent such information from disappearing, information stored in cells is re-written externally at predetermined time intervals, and this rewriting operation is referred to as a refresh operation.

During the refresh operation, the word line is enabled (or activated) at least once within a retention time of each cell contained in a memory cell array such that data can be sensed and amplified. In this case, the retention time may indicate a specific time at which certain data is written in a cell and the data stored in the cell can be maintained without being refreshed.

The refresh modes are classified into an auto refresh mode and a self-refresh mode. In the auto refresh mode, commands (/RAS, /CAS) are periodically activated during a normal operation, an internal address is generated, and the refresh operation is carried out. In the self-refresh mode, a clock enable signal is enabled when a normal operation is not performed, an internal command is generated, and the operation corresponding to the command is performed. After reception of the command, the address is generated from the refresh counter 100, such that the auto refresh mode and the self refresh mode are performed, and the address is sequentially increased whenever the memory cell receives the address.

If an auto precharge operation command is input to DRAM during normal operation of the DRAM to which tRC (Active to Active/Auto Refresh command period) is applied, the DRAM is automatically precharged after a delay time lapse caused by the tRAS (i.e., a minimum row activation time) delay circuit without using the precharge operation command of an external chipset.

A row activation time (tRAS) for use in the refresh operation to which tRFC (Auto Refresh to Active/Auto Refresh command period) is applied may be determined by an internal delay caused by a delay circuit, a delay signal that is fed back, and a row activation signal that is deactivated after a lapse of a predetermined delay time. Thereafter, a retention time period in which the row activation signal remains deactivated may be determined to be a row precharge time (tRP).

For example, assuming that the bank (BK) has a row line of 8 k bits, the refresh operation is sequentially performed in the range from a first row line to the last row line of the bank (BK). The bank (BK) may be divided into four blocks (B1~B4), each of which has a 2 k-row basis, such that the four blocks (B1~B4) are sequentially refreshed. In this case, the number of division parts of the bank (BK) may increase or decrease according to cell characteristics.

That is, the four blocks (B1~B4) are sequentially refreshed in the order of □→□→□→□ during the tRFC period. Assuming that one bank is divided on a 2 k basis, the refresh operation is performed in a manner that the blocks (B1~B4) are activated four times on a 2 k basis.

The weak cell address storage circuit 300 may sequentially store word line information (A_1, B_1, C_2) of the weak address (W_ADD) therein. That is, during a normal refresh operation, all addresses of the weak cell address storage circuit 300 are sequentially read in the order of □→□→□→□ whenever one block operates. In other words, the weak cell address storage circuit 300 is configured so that the weak address (W_ADD) is read in units of each block. Accordingly, the addresses of the weak cell address storage circuit 300 are read four times during the normal refresh operation of 8 k.

In the related art, assuming that the weak cell must be refreshed a predetermined number of times (for example, four times) during a total refresh period, the same weak cell address must be stored four times. That is, according to the related art, some weak addresses scheduled to be frequently refreshed according to weak cell characteristics may store information regarding a large number of storage times, and other weak addresses scheduled to be occasionally refreshed may store information regarding a relatively smaller number of storage times.

In this case, assuming that the weak cell characteristics deteriorate or the number of weak cells increases, the size of the related art weak cell storage circuit increases in proportion to the increasing number of weak cells.

In addition, the refresh operation of the weak cell address is performed during the refresh operation of normal addresses in the related art. If a sense amplifier (sense-amp) is shared based on addresses, it becomes difficult to perform the refresh operation by separating a normal address from a refresh address. As a result, a refresh time unavoidably increases according to the related art.

In order to obviate the above-mentioned difficulty, in the current disclosure the weak cell address storage circuit 300 according to one embodiment is designed to store the weak address (W_ADD) only once, regardless of the number of times a refresh operation is performed and the cell characteristics associated with the same weak cells. That is, although, for example, during the total refresh period the refresh operation of the weak cell is performed four times, it is necessary for the weak cell address storage circuit 300 to store the same address only once.

During the refresh operation of each block (B1~B4), the weak cell address storage circuit 300 increases the weak address (W_ADD) in the order of □→□→□→□, and then outputs the resultant weak address (W_ADD). Accordingly, the refresh control device according to an embodiment efficiently stores address information regarding the weak cell in a non-volatile storage circuit, such that the weak cell address storage circuit 300 is reduced in size, resulting in reduction in chip size.

In addition, the weak cell address control circuit 200 may compare word lines (A_1, A_2, A_3, A_4, B_1, B_3, C_2, C_4) corresponding to the refresh address (REF_ADD) with word lines (A_1, B_1, C_2) corresponding to the weak address (W_ADD). In this case, the word lines (A_1, B_1, C_2) corresponding to the weak address (W_ADD) are stored only once in the weak cell address storage circuit 300.

The refresh control device according to an embodiment may perform weak cell refreshing according to the sequential address increasing operation of the refresh counter 100. Accordingly, the addresses of the word lines (A_1, B_1, C_2) are not stored based on the cell characteristics, but are sequentially stored in the order of addresses.

If the refresh address (REF_ADD) and weak address (W_ADD) are equal to each other according to the comparison result, the weak cell address control circuit 200 may activate only the refresh address (REF_ADD). If the two addresses are different from each other according to the comparison result, the weak cell address control circuit 200 may activate not only the refresh address (REF_ADD) but also the weak address (W_ADD).

Figure 3:
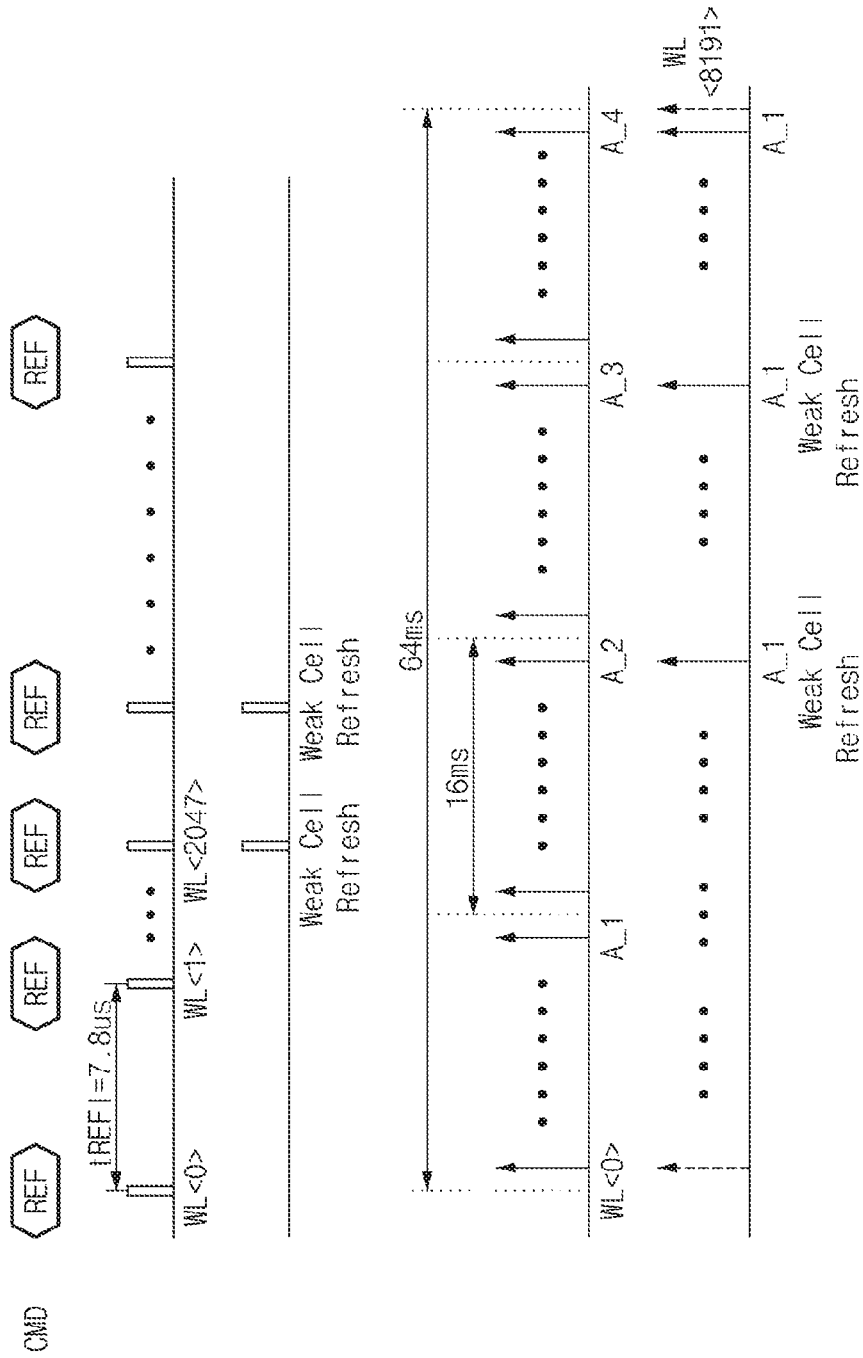
FIG. 3 is a timing diagram illustrating a representation of an example of a refresh operation of FIG. 1.

FIG. 3 is a timing diagram illustrating a representation of an example of the refresh operation of FIG. 1.

Referring to FIG. 3, the refresh signal (REF) may be activated at intervals of a refresh cycle (tREFI) in response to a refresh command. If the refresh command signal is activated, the refresh signal (REF) is activated at intervals of a predetermined time (e.g., 7.8 µs) according to specifications of the semiconductor device, such that the word lines (WL) of each memory cell are activated. Upon receiving a refresh command, the refresh control device may perform a normal refresh operation, or may simultaneously perform the normal refresh operation and the weak cell refresh operation as necessary.

For this purpose, the weak cell address control circuit 200 may compare the refresh address (REF_ADD) with the weak address (W_ADD) during the weak cell refresh operation. Therefore, the weak cell address control circuit 200 may detect the weak address (W_ADD) using the normal refresh address (REF_ADD), and may refresh not only the normal refresh address (REF_ADD) but also the weak address (W_ADD).

It is possible to recognize the position of the bank's (BK) word lines as simultaneously operated according to the normal refresh address (REF_ADD) and the weak address (W_ADD). Addresses configured to share the same sense amplifier (sense-amp) are not operated at the same time, so that the refresh address (REF_ADD) and the weak address (W_ADD) may operate simultaneously. In this case, an additional time period for refreshing the weak address (W_ADD) is no longer required, resulting in reduction of a refresh time.

For example, assuming that the word line (A_1) is applied to the refresh address (REF_ADD) of the block B1, the word line (A_1) may correspond to the weak address (W_ADD). Accordingly, the word line (A_1) is activated only once using the normal refresh address (REF_ADD). The word line (B_1) is a weak address (W_ADD), such that the word line (B_1) is activated only once using the normal refresh address (REF_ADD).

If the word line (A_2) corresponds to the refresh address (REF_ADD) in the block (B2), the word line (A_2) does not correspond to the weak address (W_ADD). As a result, the word line (A_2) not corresponding to the weak address (W_ADD) and the word line (A_1) corresponding to the weak address (W_ADD) are simultaneously activated. The word line (C_2) corresponds to the weak address (W_ADD), thus the word line (C_2) is activated only once using the refresh address (REF_ADD).

In addition, if the word line (A_3) corresponds to the refresh address (REF_ADD) in the block (B3), the word line (A_3) does not correspond to the weak address (W_ADD). Therefore, the word line (A_3) not corresponding to the weak address (W_ADD) and the word line (A_1) corresponding to the weak address (W_ADD) are simultaneously activated. If the word line (B_3) corresponds to the refresh address (REF_ADD), the word line (B_3) may not correspond to the weak address (W_ADD). As a result, the word line (A_3) not corresponding to the weak address (W_ADD) and the word line (B_1) corresponding to the weak address (W_ADD) are simultaneously activated.

In addition, if the word line (A_4) corresponds to the refresh address (REF_ADD) in the block (B4), the word line (A_4) may not correspond to the weak address (W_ADD). Therefore, the word line (A_4) not corresponding to the weak address (W_ADD) and the word line (A_1) corresponding to the weak address (W_ADD) are simultaneously activated. If the word line (C_4) corresponds to the refresh address (REF_ADD), the word line (C_4) may not correspond to the weak address (W_ADD). As a result, the word line (C_4) not corresponding to the weak address (W_ADD) and the word line (C_2) corresponding to the weak address (W_ADD) are simultaneously activated.

In accordance with one embodiment, it is assumed that the word lines (A_2, A_3, B_3, A_4, C_4) are used as the normal addresses and each word line is activated at intervals of a predetermined time of 64 ms. It is assumed that the blocks (B1, B2) used as lower bits are lower blocks, and the blocks (B3, B4) used as higher bits are upper blocks.

It is also assumed that the word line (A_1) corresponding to the weak address (W_ADD) having the weakest (or lowest) characteristics has weak cell characteristics of 16 ms. As a result, the word line (A_1) must be activated four times within a total time period of 64 ms so as to perform the weak cell refresh operation. Therefore, the word line (A_1) may be activated four times in each of the blocks (B1~B4).

However, assuming that the word line (A_1) corresponds to the weak address (W_ADD), only the normal word line (A_1) must be activated only once during the normal refresh operation. As a result, the word line (A_1) may be activated only three times, but not four times.

It is assumed that the address (B_1) corresponding to the weak address (W_ADD) has weak cell characteristics of 32 ms. As a result, the address (B_1) may be activated twice in each of the lower block (B1) and the upper block (B3) within a total time period of 64 ms.

It is also assumed that the address (C_2) corresponding to the weak address (W_ADD) has weak cell characteristics of 32 ms. As a result, the address (C_2) may be activated twice in each of the lower block (B2) and the upper block (B4) within a total time period of 64 ms.

Although the embodiment has exemplarily disclosed that a self-refresh entry period defined in the specification of the semiconductor device is set to 7.8 μs, the scope or spirit of embodiments of the present disclosure are not limited thereto, and the self-refresh entry period may also be set to another time as necessary. In addition, the refresh periods of the refresh address and the weak address according to embodiments are not limited thereto.

Figure 4:
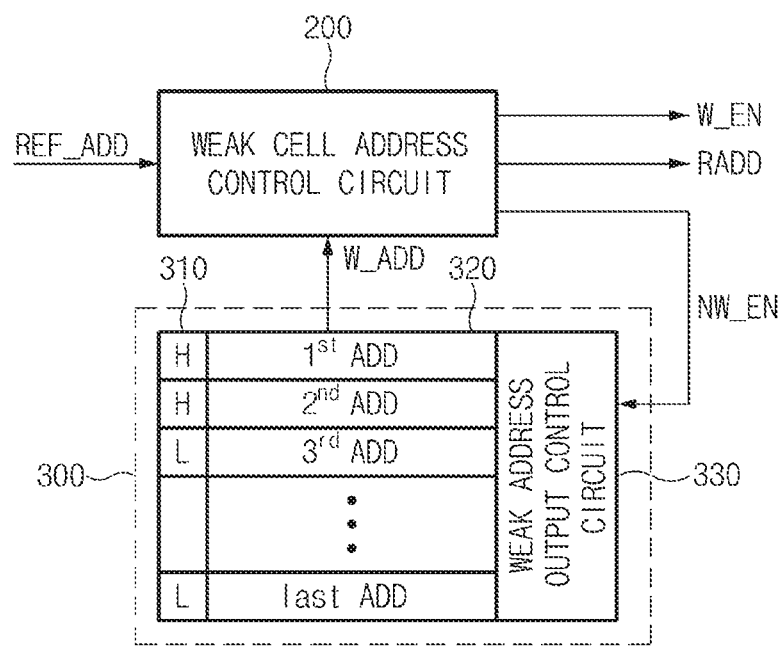
FIG. 4 is a detailed circuit diagram illustrating the weak cell address storage circuit shown in FIG. 1.

FIG. 4 is a detailed circuit diagram illustrating the weak cell address storage circuit 300 shown in FIG. 1.

Referring to FIG. 4, the weak cell address storage circuit 300 may include a cell characteristic storage circuit 310, a storage circuit 320, and a weak address output control circuit 330.

In this case, the cell characteristic storage circuit 310 may store the cell characteristics of the weak address (W_ADD) therein. The number of bits configured to store cell characteristics may increase according to the weak cell characteristics.

The cell characteristic storage circuit 310 may store a logic high level (H) when the weak address (W_ADD) has poor cell characteristics. For example, this means that the weak address has cell characteristics of 16 ms such that the weak address must be refreshed four times during the refresh time period.

On the other hand, the cell characteristic storage circuit 310 may store a logic low level (L) when the weak address (W_ADD) has relatively superior cell characteristics. For example, this means that the weak address has cell characteristics of 32 ms such that the weak address must be refreshed twice during the refresh time period.

The storage circuit 320 may sequentially store addresses of the weak cells as the weak addresses (W_ADD) therein. The weak addresses (W_ADD) stored in the storage circuit 320 may be sequentially output to the weak cell address control circuit 200 upon receiving a control signal from the weak address output control circuit 330.

In addition, the weak address output control circuit 330 may sequentially output the weak address (W_ADD) stored in the storage circuit 320 to the weak cell address control circuit 200 in response to a subsequent weak enable signal (NW_EN) received from the weak cell address control circuit 200.

Figure 5:
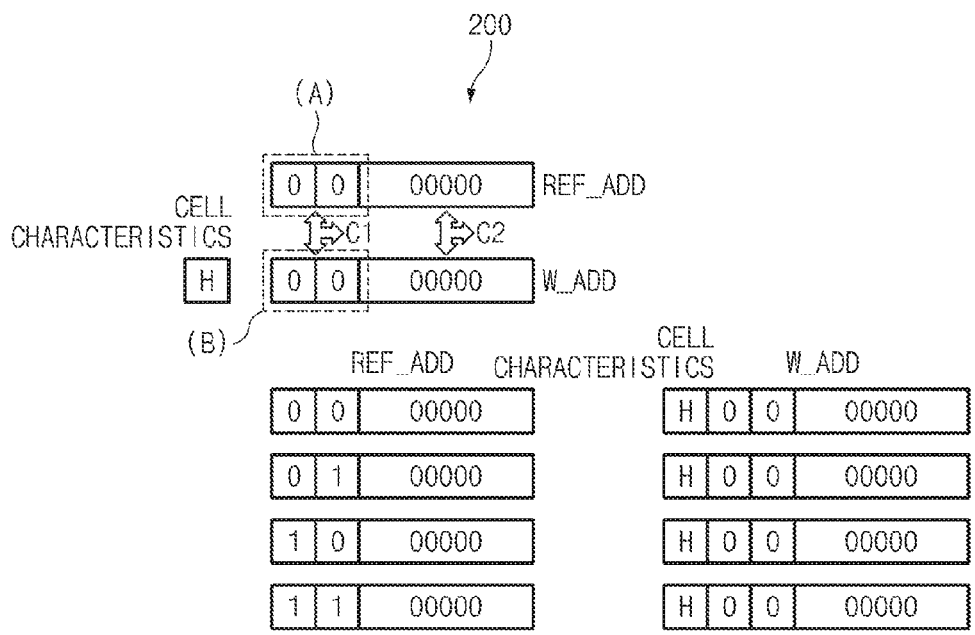
FIGS. 5 and 6 are conceptual diagrams illustrating representations of examples of operation of the weak cell address control circuit shown in FIG. 1.
Figure 6:
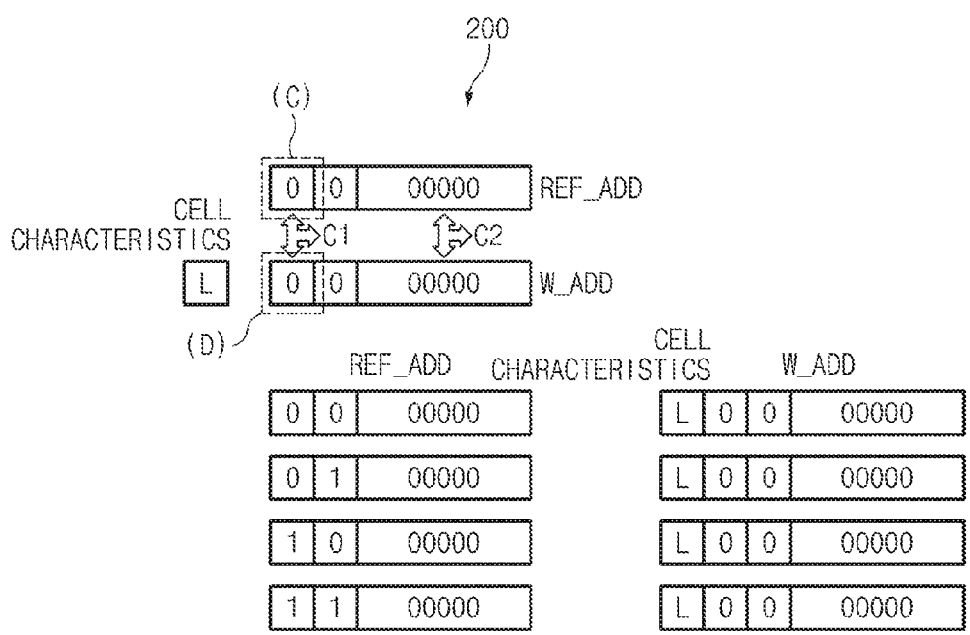

FIGS. 5 and 6 are conceptual diagrams illustrating representations of examples of the operation of the weak cell address control circuit 200 shown in FIG. 1.

Referring to FIGS. 5 and 6, the weak cell address control circuit 200 may compare the refresh address (REF_ADD) with the weak address (W_ADD) such that the weak cell address control circuit 200 outputs the weak enable signal (W_EN) and a subsequent weak enable signal (NW_EN).

A first weak address W_ADD(1st ADD) is applied to the weak cell address control circuit 200, such that the first weak address (W_ADD) (i.e., 1st ADD) is compared with the refresh address (REF_ADD). The weak cell address control circuit 200 may repeatedly perform the above comparison operation until receiving the refresh address (REF_ADD) equal to the first weak address W_ADD(1st ADD).

If the first weak address W_ADD(1st ADD) is equal to the refresh address (REF_ADD), the weak cell address control circuit 200 may allow the weak enable signal (W_EN) to transition to a logic low level. The weak cell address control circuit 200 only activates the normal refresh address (REF_ADD) when the weak enable signal (W_EN) is at a logic low level, such that the weak cell address control circuit 200 transmits the activated normal refresh address (REF_ADD) to the row address control circuit 400.

On the other hand, assuming that the first weak address W_ADD(1st ADD) is different from the refresh address (REF_ADD), the weak cell address control circuit 200 may control the weak enable signal (W_EN) to transition to a logic high level. If the weak enable signal (W_EN) is at a logic high level, the weak cell address control circuit 200 may output a row address (RADD) corresponding to the weak address (W_ADD) to the row address control circuit 400.

If the subsequent weak enable signal (NW_EN) transitions to a logic high level, the weak address output control circuit 330 may output a second weak address W_ADD(2nd ADD) to the weak cell address control circuit 200. The subsequent operation process is identical to the comparison operation of the first weak address W_ADD(1st ADD).

FIG. 5 exemplarily illustrates that the cell characteristic storage circuit 310 has cell characteristics corresponding to a logic high level (H). In FIG. 5, (A) may denote an upper 2-bits of data indicating selection information of the blocks (B1~B4) in the refresh address (REF_ADD). That is, (A) may denote 2 data bits corresponding to a most significant bit (MSB) part.

For example, the block (B1) may be denoted by the 2-bit data set of "00", and the block (B2) may be denoted by the 2-bit data set of "10". The block (B3) may be denoted by the 2-bit data set of "01", and the block (B4) may be denoted by the 2-bit data set of "11".

In FIG. 5, (B) may denote an upper 2-bits of data indicating selection information of the storage circuit 320 from among weak addresses (W_ADD) of the storage circuit 320. That is, (B) may denote 2 bits of data corresponding to a most significant bit (MSB) part.

If the weak cell has cell characteristics corresponding to a logic high level (H), the weak cell address control circuit 200 may compare an upper 2-bits of data corresponding to the most significant bits (MSB) of the refresh address (REF_ADD) with an upper 2-bits of data corresponding to the most significant bits (MSB) of the weak address (W_ADD), and output the resultant value (C1) according to the result of the comparison. The weak cell address control circuit 200 may compare the remaining lower data bits of the refresh address (REF_ADD) with the remaining lower data bits of the weak address (W_ADD), and output the resultant value (C2) according to the result of the comparison.

If the resultant values (C1, C2) are at a logic high level, the weak cell address control circuit 200 may indicate that the refresh address (REF_ADD) is equal to the weak address (W_ADD) within the same block. Therefore, the weak cell address control circuit 200 needs to perform the normal refresh operation without refreshing the weak address, such that the weak cell address control circuit 200 outputs the weak enable signal (W_EN) at a logic low level, and outputs the subsequent weak enable signal (NW_EN) to the weak cell address storage circuit 300, for example, at a logic high level.

As a result, a subsequent weak address (W_ADD) of the storage circuit 310 is output to the weak cell address control circuit 200 according to the subsequent weak enable signal (NW_EN).

If the resultant value (C1) of the weak cell address control circuit 200 is at a logic low level and the resultant value (C2) is at a logic high level, this means that the refresh address (REF_ADD) and the weak address (W_ADD) are equal to each other in different blocks. Accordingly, the weak cell address control circuit 200 must simultaneously perform the weak address refresh operation and the normal refresh operation, such that the weak enable signal (W_EN) and the subsequent weak enable signal (NW_EN) are output at a logic high level.

The subsequent weak address (W_ADD) of the storage circuit 310 is output to the weak cell address control circuit 200 in response to the subsequent weak enable signal (NW_EN).

That is, assuming that the region (A) is denoted by "0, 0" and the region (B) is denoted by "0, 0", this means that the refresh address (REF_ADD) is equal to the weak address (W_ADD) in the same block. Accordingly, the weak cell address control circuit 200 must perform only the normal refresh operation, such that the weak enable signal (W_EN) is output at a logic low level and the subsequent weak enable signal (NW_EN) is output at a logic high level.

In a first case in which the region (A) is denoted by "0, 1" and the region (B) is denoted by "0, 0", in a second case in which the region (A) is denoted by "1, 0" and the region (B) is denoted by "0, 1", or in a third case in which the region (A) is denoted by "1, 1" and the region (B) is denoted by "0, 0", this means that the refresh address (REF_ADD) is equal to the weak address (W_ADD) in different blocks. Accordingly, the weak cell address control circuit 200 must simultaneously perform the weak address refresh operation and the normal refresh operation, such that the weak enable signal (W_EN) and the subsequent weak enable signal (NW_EN) are output at a logic high level.

As a result, the subsequent weak address (W_ADD) of the storage circuit 310 is output to the weak cell address control circuit 200 according to the subsequent weak enable signal (NW_EN).

FIG. 6 illustrates an example when the cell characteristic storage circuit 310 has cell characteristics corresponding to a logic low level (L).

If the weak cell has cell characteristics corresponding to a logic low level (L), the weak cell address control circuit 200 may compare an upper 1-bit of data within the most significant bit (MSB) of the refresh address (REF_ADD) shown in FIG. 6(C) with an upper 1-bit of data within the most significant bit (MSB) of the weak address (W_ADD) shown in FIG. 6(D), and thus output the resultant value "C1" according to the result of the comparison. The weak cell address control circuit 200 may compare the remaining lower-bit of data of the refresh address (REF_ADD) with the remaining lower-bit of data of the weak address (W_ADD), and thus output the resultant value "C2" according to the result of the comparison.

If the resultant values (C1, C2) are at a logic high level, the weak cell address control circuit 200 may indicate that the refresh address (REF_ADD) is equal to the weak address (W_ADD) in the same block. Accordingly, the weak cell address control circuit 200 only needs to perform the normal refresh operation without refreshing the weak address, such that the weak enable signal (W_EN) is output at a logic low level and the subsequent weak enable signal (NW_EN) is output at a logic high level.

As a result, the subsequent weak address (W_ADD) of the storage circuit 310 is output to the weak cell address control circuit 200 in response to the subsequent weak enable signal (NW_EN).

If the resultant value (C1) of the weak cell address control circuit 200 is at a logic low level and the resultant value (C2) is at a logic high level, this means that the refresh address (REF_ADD) and the weak address (W_ADD) are equal to each other in different blocks. Therefore, the weak cell address control circuit 200 must simultaneously perform the weak address refresh operation and the normal refresh operation, such that the weak enable signal (W_EN) and the subsequent weak enable signal (NW_EN) are output at a logic high level.

As a result, the subsequent weak address (W_ADD) of the storage circuit 310 is output to the weak cell address control circuit 200 in response to receiving the subsequent weak enable signal (NW_EN).

That is, assuming that the region (C) is denoted by "0" and the region (D) is denoted by "0", this means that the refresh address (REF_ADD) is equal to the weak address (W_ADD) in different blocks. Accordingly, the weak cell address control circuit 200 only needs to perform the normal refresh operation, such that the weak enable signal (W_EN) is output at a logic low level and the subsequent weak enable signal (NW_EN) is output at a logic high level.

If the region (C) is denoted by "1" and the region (D) is denoted by "1", this means that the weak address refresh operation and the normal refresh operation must be simultaneously performed, such that the weak enable signal (W_EN) and the subsequent weak enable signal (NW_EN) are output at a logic high level. As a result, the subsequent weak address (W_ADD) of the storage circuit 310 is output to the weak cell address control circuit 200 in response to the subsequent weak enable signal (NW_EN).

As is apparent from the above description, the refresh control device according to embodiments stores a weak cell address #1 in a non-volatile address storage circuit irrespective of the number of refresh times for the same weak cell, such that a weak cell refresh address can be efficiently stored.

The refresh control device according to embodiments stores a weak cell address #1 in a non-volatile address storage circuit irrespective of the number of refresh times for the same weak cell, thereby efficiently storing a weak cell refresh address therein.

The refresh control device according to embodiments reduces the size of an address storage circuit and the size of a chip region.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the present disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the present disclosure or included as a new claim by a subsequent amendment after the application is filed.

Although a number of illustrative embodiments consistent with the present disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

Figure 7:
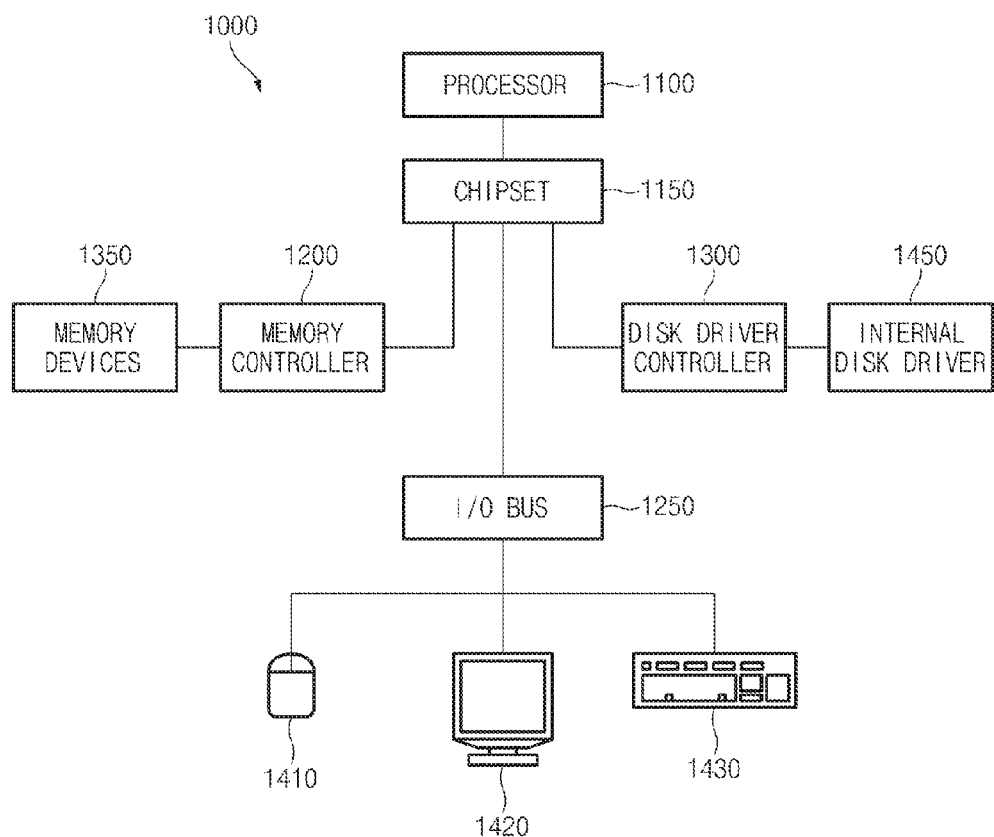
FIG. 7 illustrates a block diagram of an example system employing a refresh control device in accordance with the various embodiments discussed above with relation to FIGS. 1-6.

The semiconductor devices and/or a refresh control device discussed above (see FIGS. 1-6) are particularly useful in the design of memory devices, processors, and computer systems. For example, referring to FIG. 7, a block diagram of a system employing a semiconductor device and/or refresh control device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or a refresh control device as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or a refresh control device as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor device and/or a refresh control device as discussed above with relation to FIGS. 1-6. In alternate embodiments, such as, for example but not limited to, cellular phones or digital cameras, the components may differ from the embodiments illustrated in FIG. 7.

What is claimed is:

1. A refresh control device comprising:
    a weak cell address storage circuit configured to sequentially store a weak address corresponding to a weak cell;
    a weak cell address control circuit configured to output a weak enable signal and a row address corresponding to the weak address by comparing a refresh address with the weak address, selectively activating the weak enable signal and the row address according to the result of the comparison; and
    a row address control circuit configured to control a refresh operation by selectively activating a word line of a bank in response to the refresh address, the weak enable signal, and the row address,
    wherein, if the refresh address is equal to the weak address, the weak cell address control circuit outputs a subsequent weak enable signal to the weak cell address storage circuit.

2. The refresh control device according to claim 1, further comprising:
    a refresh counter configured to generate the refresh address by counting a refresh signal.

3. The refresh control device according to claim 1, wherein:
  if the refresh address is equal to the weak address, the weak cell address control circuit outputs the weak enable signal at a first logic level; and
  if the refresh address is different from the weak address, the weak cell address control circuit outputs the weak enable signal at a second logic level.

4. The refresh control device according to claim 3, wherein:
  if the weak enable signal is at the first logic level, the weak cell address control circuit only activates the refresh address; and
  if the weak enable signal is at the second logic level, the weak cell address control circuit activates the refresh address and the row address.

5. The refresh control device according to claim 1, wherein the weak cell address storage circuit sequentially outputs the weak address to the weak cell address control circuit upon receiving a subsequent weak enable signal from the weak cell address control circuit.

6. The refresh control device according to claim 1, wherein the weak cell address storage circuit stores the weak address only once, irrespective of the number of times the refresh operation is performed and cell characteristics associated with the same weak cell.

7. The refresh control device according to claim 1, wherein the weak cell address storage circuit sequentially stores a refresh operation of the weak cell in order of the weak address.

8. The refresh control device according to claim 1, wherein:
  if the refresh address is equal to the weak address, a normal refresh operation and a weak cell refresh operation are simultaneously performed.

9. The refresh control device according to claim 1, wherein the weak cell address storage circuit includes:
  a cell characteristic storage circuit configured to store cell characteristics of the weak address;
  a storage circuit configured to sequentially store the weak address; and
  a weak address output control circuit configured to sequentially output the weak address to the weak cell address control circuit in response to a subsequent weak enable signal.

10. The refresh control device according to claim 9, wherein the cell characteristic storage circuit stores a logic low level signal or a logic high level signal in response to the cell characteristics of the weak address.

11. The refresh control device according to claim 1, wherein:
  the weak cell address control circuit outputs a first resultant value by comparing upper bits of the refresh address with upper bits of the weak address, and outputs a second resultant value by comparing the remaining lower bits of the refresh address with the remaining lower bits of the weak address; and
  the weak cell address control circuit controls a logic level of the weak enable signal in response to the first resultant value and the second resultant value.

12. The refresh control device according to claim 11, wherein:
  if the weak cell has cell characteristics corresponding to a first logic level, the weak cell address control circuit compares 2 bits corresponding to the most significant bits (MSB) of the refresh address with 2 bits corresponding to the MSB of the weak address.

13. The refresh control device according to claim 11, wherein:
  if the weak cell has cell characteristics corresponding to a second logic level, the weak cell address control circuit compares 1 bit corresponding to a most significant bit (MSB) of the refresh address with 1 bit corresponding to a MSB of the weak address.

14. A refresh control device comprising:
  a refresh counter configured to generate a refresh address by counting a refresh signal;
  a weak cell address storage circuit configured to sequentially store a weak address corresponding to a weak cell;
  a weak cell address control circuit configured to output a weak enable signal and a row address corresponding to the weak address by comparing the refresh address with the weak address, selectively activating the weak enable signal and the row address according to the result of the comparison;
  a row address control circuit configured to selectively activate a word line in response to the refresh address, the weak enable signal, and the row address; and
  a bank in which the word line is selectively activated according to a control signal of the row address control circuit such that a refresh operation is carried out,
  wherein, if the refresh address is equal to the weak address, the weak cell address control circuit outputs a subsequent weak enable signal to the weak cell address storage circuit.

15. The refresh control device according to claim 14, wherein the bank is divided into a plurality of blocks such that the blocks are sequentially refreshed.

16. The refresh control device according to claim 15, wherein the weak cell address storage circuit is configured in a manner that the weak address is read in units of each block.

17. The refresh control device according to claim 14, wherein the weak cell address storage circuit includes:
  a cell characteristic storage circuit configured to store cell characteristics of the weak address;
  a storage circuit configured to sequentially store the weak address; and
  a weak address output control circuit configured to sequentially output the weak address to the weak cell address control circuit in response to a subsequent weak enable signal.

18. The refresh control device according to claim 14, wherein the weak cell address storage circuit stores the weak address only once, irrespective of the number of times the refresh operation is performed and cell characteristics associated with the same weak cell.

19. The refresh control device according to claim 14, wherein:
  the weak cell address control circuit outputs a first resultant value by comparing upper bits of the refresh address with upper bits of the weak address, and outputs a second resultant value by comparing the remaining lower bits of the refresh address with the remaining lower bits of the weak address; and
  the weak cell address control circuit controls a logic level of the weak enable signal in response to the first resultant value and the second resultant value.

* * * * *